(12) United States Patent
    Wang

(10) Patent No.: US 10,290,696 B2
(45) Date of Patent: May 14, 2019

(54) FLEXIBLE DISPLAY SUBSTRATE, DISPLAY PANEL, AND DISPLAY DEVICE

(71) Applicant: BOE Technology Group Co., Ltd., Beijing (CN)

(72) Inventor: Li Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/843,031

(22) Filed: Dec. 15, 2017

(65) Prior Publication Data
    US 2018/0324939 A1 Nov. 8, 2018

(30) Foreign Application Priority Data
    May 3, 2017 (CN) .......................... 2017 1 0305328

(51) Int. Cl.
    *H01L 27/32* (2006.01)
    *H05K 1/02* (2006.01)
    *H01L 27/12* (2006.01)
    *H05K 1/11* (2006.01)

(52) U.S. Cl.
    CPC ........ *H01L 27/3288* (2013.01); *H01L 27/124* (2013.01); *H01L 27/1218* (2013.01); *H05K 1/028* (2013.01); *H05K 1/115* (2013.01); *H05K 2201/09272* (2013.01); *H05K 2201/10128* (2013.01); *H05K 2201/10136* (2013.01)

(58) Field of Classification Search
    CPC .......................... H01L 27/3288; H01L 27/329
    See application file for complete search history.

(56) References Cited

U.S. PATENT DOCUMENTS

| | | | |
|---|---|---|---|
| 2014/0217373 A1 | 8/2014 | Youn et al. | |
| 2015/0179728 A1 | 6/2015 | Kwon et al. | |
| 2016/0103534 A1 | 4/2016 | Zhang et al. | |
| 2018/0088356 A1* | 3/2018 | Chen ..................... | G02F 1/0102 |

FOREIGN PATENT DOCUMENTS

| | | |
|---|---|---|
| CN | 202018547 U | 10/2011 |
| CN | 102593095 A | 7/2012 |
| CN | 103700320 A | 4/2014 |

OTHER PUBLICATIONS

Chinese Office Action for corresponding CN 201710305328.8 dated Nov. 2, 2018.

* cited by examiner

*Primary Examiner* — Jeremy C Norris
(74) *Attorney, Agent, or Firm* — Arent Fox LLP; Michael Fainberg (57) ABSTRACT

Disclosed are a flexible display substrate, a display panel, and a display device. A traveling wire in a fixed bending area includes a plurality of sequentially connected wire segments at a preset inclination angle relative to the extension direction of the traveling wire, and furthermore hole structures are arranged on at least a part of the wire segments. Moreover there is a planar contact structure between at least two of wire segments connected with each other.

16 Claims, 6 Drawing Sheets

FLEXIBLE DISPLAY SUBSTRATE, DISPLAY PANEL, AND DISPLAY DEVICE

CROSS-REFERENCE TO RELATED APPLICATION

This application claims priority of Chinese Patent Application No. 201710305328.8, filed on May 3, 2017, which is hereby incorporated by reference in its entirety.

FIELD

The present disclosure relates to the field of display technologies, and particularly to a flexible display substrate, a display panel, and a display device.

BACKGROUND

The market of display products is currently growing rapidly, and as there is a growing demand of consumers for notebook computers, smart mobile phones, TV sets, tablet computers, smart watches, fitness wrist bands, and other various display products, more new display products will emerge in the future.

A display product with a narrow edge frame can provide its user with a better watching experience, and thus is abstracting a large number of consumers, and has a promising prospect in the market. In order to better accommodate the demand in the market for the display product with a narrow edge frame, it has been proposed to apply pad bending to a flexible display panel to thereby greatly narrow the edge frame of a driver side.

SUMMARY

Accordingly an embodiment of the disclosure provides a flexible display substrate including: a flexible base substrate, and traveling wires arranged in a fixed bending area on the flexible display substrate, wherein each of the traveling wires includes a plurality of wire segments connected in sequence; respective wire segments are inclined at a preset inclination angle from an extension direction of the traveling wire, and at least a part of the wire segments include porous structures; and there is a planar contact structure between at least two of the wire segments connected with each other.

Optionally, in the flexible display substrate above according to the embodiment of the disclosure, there are different inclination directions of two of the wire segments, connected with each other, relative to the extension direction of the traveling wire.

Optionally, in the flexible display substrate above according to the embodiment of the disclosure, there is a substantially same inclination angle of the two of the wire segments connected with each other, relative to the extension direction of the traveling wire.

Optionally, in the flexible display substrate above according to the embodiment of the disclosure, the at least two of the wire segments comprise at least one hole structure.

Optionally, in the flexible display substrate above according to the embodiment of the disclosure, the hole structures in the at least two of the wire segments are communicated with each other.

Optionally, in the flexible display substrate above according to the embodiment of the disclosure, the hole structures in the at least two of the wire segments are separate from each other, and a part of areas of the hole structures in the at least two of the wire segments are located on a straight line which is parallel to the extension direction of the traveling wire and an orthographic projection thereof is on the planner contact structure.

Optionally, in the flexible display substrate above according to the embodiment of the disclosure, the hole structures in the at least two of the wire segments are separate from each other, and a part of areas of the hole structures in the at least two of the wire segments connected with each other are located on a straight line which is perpendicular to the extension direction of the traveling wire and an orthographic projection thereof is on the planner contact structure.

Optionally, in the flexible display substrate above according to the embodiment of the disclosure, a material of the traveling wire is metal.

Optionally, in the flexible display substrate above according to the embodiment of the disclosure, the traveling wire is one of a scan line, a data signal line, a clock signal line, and a touch signal line.

Optionally, in the flexible display substrate above according to the embodiment of the disclosure, the traveling wire is a combination of a scan line, a data signal line, a clock signal line, and a touch signal line.

Optionally, in the flexible display substrate above according to the embodiment of the disclosure, the flexible display substrate is an array substrate, an opposite substrate, or a touch substrate.

An embodiment of the disclosure provides a display panel including the flexible display substrate above.

Optionally, the display panel is a liquid crystal display panel, an organic electroluminescent display panel, or a quantum dot light-emitting display panel.

An embodiment of the disclosure provides a display device including the display panel.

DETAILED DESCRIPTION OF THE EMBODIMENTS

Optional implementations of the flexible display substrate, the display panel, and the display device according to embodiments of the disclosure will be described below in details with reference to the drawings.

Figure 1A:
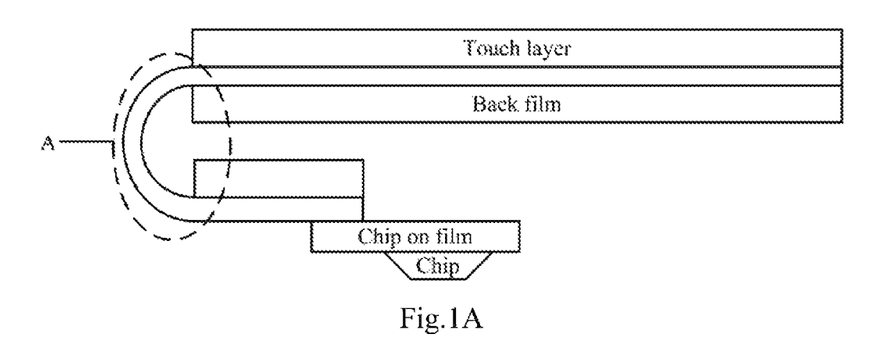
FIG. 1A is a schematic structural diagram of a flexible display substrate in the related art.
Figure 1B:
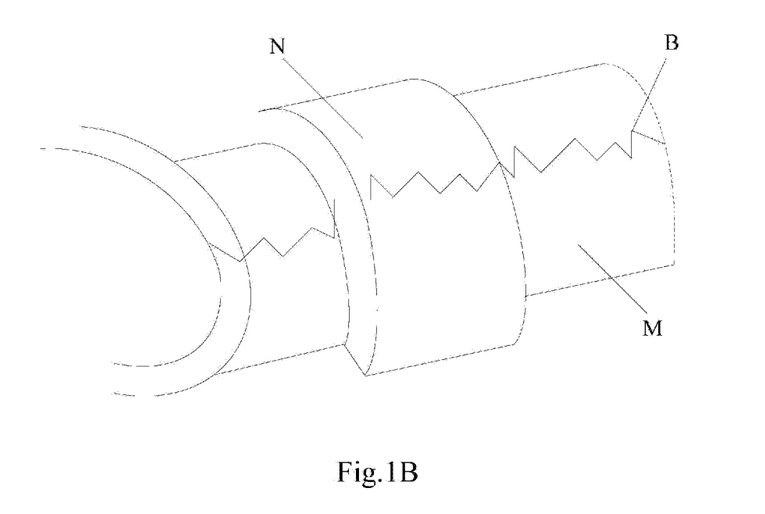
FIG. 1B is a schematic structural diagram of a magnified dotted section A in FIG. 1A.

As illustrated in FIG. 1A and FIG. 1B, however, an organic insulation layer M is so fragile that a crack B may be generated at the organic insulation layer M in a bending area A at the edge of the flexible display panel due to pad bending, and the crack B may further extend to a traveling wire N, so that the traveling wire N may be cracked or broken, thus resulting in a display failure.

An embodiment of the disclosure provides a flexible display substrate including: a flexible base substrate, and traveling wires arranged in a fixed bending area on the flexible display substrate, where as illustrated in FIG. 2 to FIG. 6, each traveling wire 001 includes a plurality of wire segments 101 connected in sequence. The respective wire segments 101 are inclined at a preset inclination angle θ from an extension direction D1 of the traveling wire 001, and at least a part of the wire segments 101 include a hole structure 102. There is a planar contact structure 103 between every two wire segments 101 connected with each other. Optionally, every two wire segments 101 are connected with each other through overlapping with each other partially. The overlapping area forms the planner contact structure 103.

In the flexible display substrate above according to the embodiment of the disclosure, the traveling wire 001 in the fixed bending area includes the plurality of sequentially connected wire segments 101 at the preset inclination angle θ relative to the extension direction D1 of the traveling wire 001, so that a bending stress on the traveling wire 001 can be decentralized onto the respective wire segments 101; and furthermore the hole structures 102 are arranged on at least a part of the wire segments 100, so that the bending stress decentralized onto the respective wire segments 101 can be spread into edge areas of the hole structures 102, and thus the bending stress on the traveling wire 001 can be significantly decentralized, thus greatly lowering a risk of the traveling wire 001 being cracked or broken in the fixed bending area. Moreover there is the planar contact structure 103 between every two wire segments 101 connected with each other, that is, the planar contact structure 103 is defined by two sides, in contact with each other, of every two adjacent wire segments 101, so that every two adjacent wire segments 101 are connected with each other in an area-contact mode. In this way, there are a plurality of contact points between every two wire segments 101 connected with each other, and even if the traveling wire 001 is cracked or broken at any one of the contact points, then the two adjacent wire segments 101 can be connected with each other at another contact point, thus further lowering the risk of the traveling wire 001 being cracked or broken. Moreover as compared with the general traveling wire in the related art, the adjacent wire segments 101 are arranged in a staggered and inclined pattern given an arrangement pitch of the traveling wire to thereby increase the width of the traveling wire 001, and lower the resistance of the traveling wire 001.

It shall be noted that in the flexible display substrate above according to the embodiment of the disclosure, every two adjacent wire segments 101 can alternatively be connected otherwise, for example, every two wire segments 101 connected with each other can be connected in a point-contact mode, although the embodiment of the disclosure will not be limited thereto.

Figure 2:
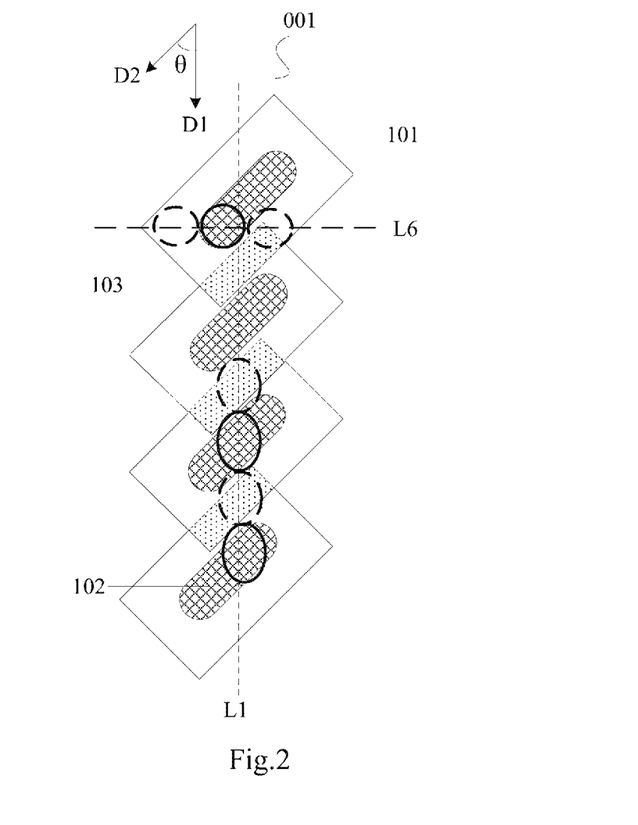
FIG. 2 to FIG. 6 are schematic structural diagrams of a traveling wire according to an embodiment of the disclosure respectively.
Figure 3:
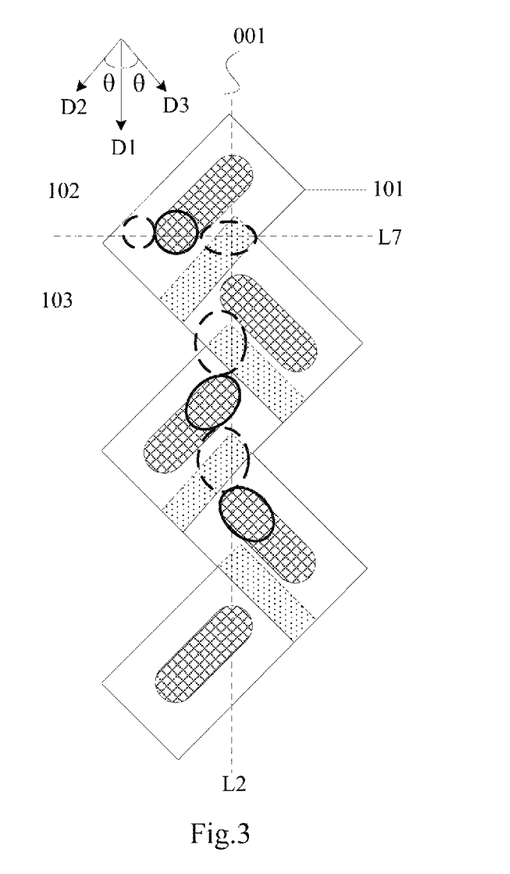
Figure 6:
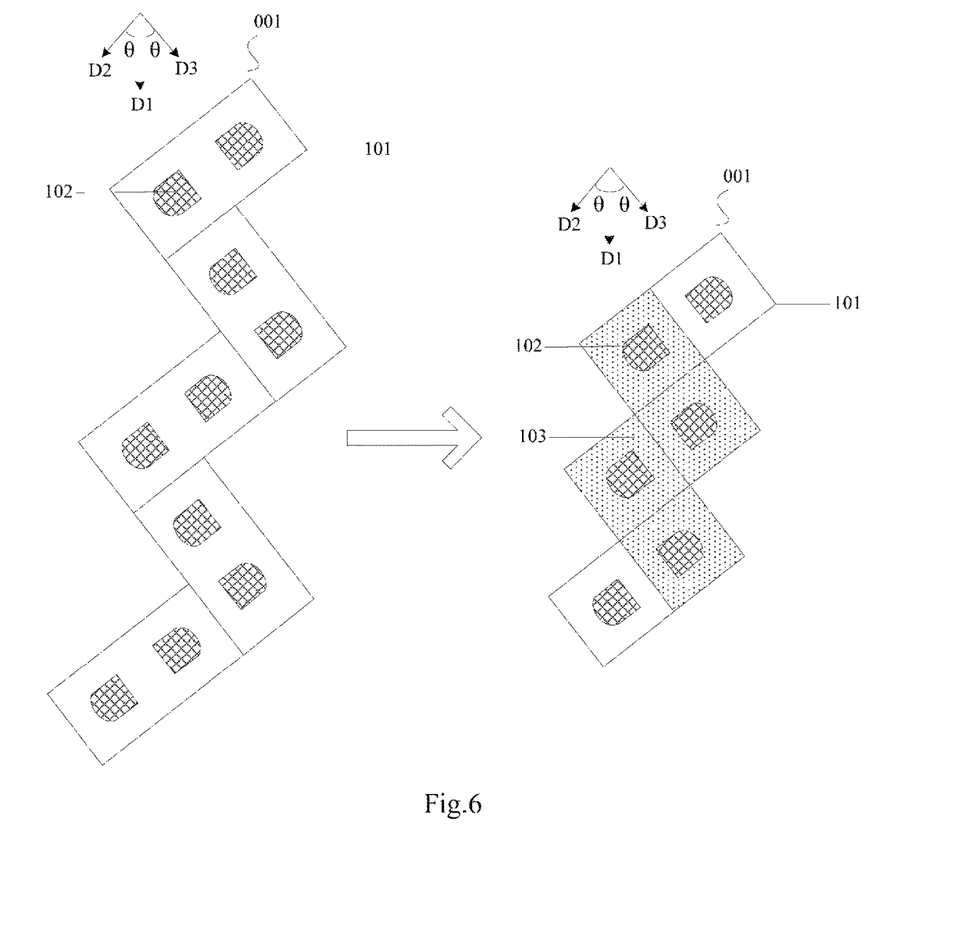

It shall be noted that in the flexible display substrate above according to the embodiment of the disclosure, the size of the preset inclination angle θ of the respective wire segments 101 relative to the extension direction D1 of the traveling wire 001, the sizes of the hole structures 102 of the respective wire segments 101, and the wire width of the traveling wire 001 can be preset as need in reality under a process condition, although the embodiment of the disclosure will not be limited thereto. Furthermore there may be a number of shapes of the respective wire segments 101, and for example, the respective wire segments 101 are rectangular as illustrated in FIG. 2 and FIG. 6; or, of course, the shapes of the respective wire segments 101 can alternatively be a round, an ellipse, a triangle, a square, a diamond, a trapezoid, a star, a regular polygon, or any other regular or irregular pattern, although the embodiment of the disclosure will not be limited thereto. Moreover there may be a number of shapes of the hole structures 102 of the respective wire segments 101; and for example, their shapes may be an ellipse as illustrated in FIG. 2 and FIG. 3, and in another example, their shapes may be an irregular ellipse as illustrated in FIG. 4 and FIG. 6; of course, their shapes may alternatively be a round, a triangle, a square, a rectangle, a diamond, a trapezoid, a star, a regular polygon, or any other regular or irregular pattern, although the embodiment of the disclosure will not be limited thereto.

Moreover there may be one or more fixed bending areas in the flexible display substrate above according to the embodiment of the disclosure, although the embodiment of the disclosure will not be limited thereto. For example, the fixed bending areas may be the bending area A at the edge of the flexible display panel to which pad bending is applied as illustrated in FIG. 1A, or may be a curved display area on two sides of a curved display panel, or may be the entire display area on an electric paper display panel.

In an optional implementation, in the flexible display substrate above according to the embodiment of the disclosure, there may be a number of implementations of the extension directions of the respective wire segments 101, and two optional implementations thereof will be described below.

Figure 4:
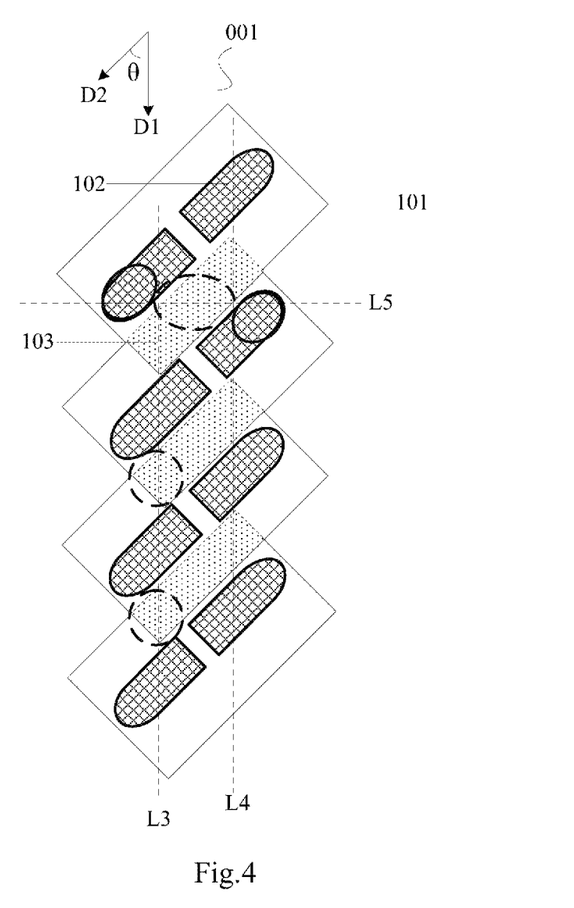

In an implementation as illustrated in FIG. 2 and FIG. 4, there is the substantially same inclination direction D2 of every two wire segments 101, connected with each other, relative to the extension direction D1 of the traveling wire 001, that is, the respective wire segments 101 are inclined leftward relative to the extension direction D1 of the traveling wire 001 as illustrated in FIG. 2 and FIG. 4. Of course, in a particular implementation, the respective wire segments 101 can alternatively be inclined rightward relative to the extension direction D1 of the traveling wire 001, although the embodiment of the disclosure will not be limited thereto.

Figure 5:
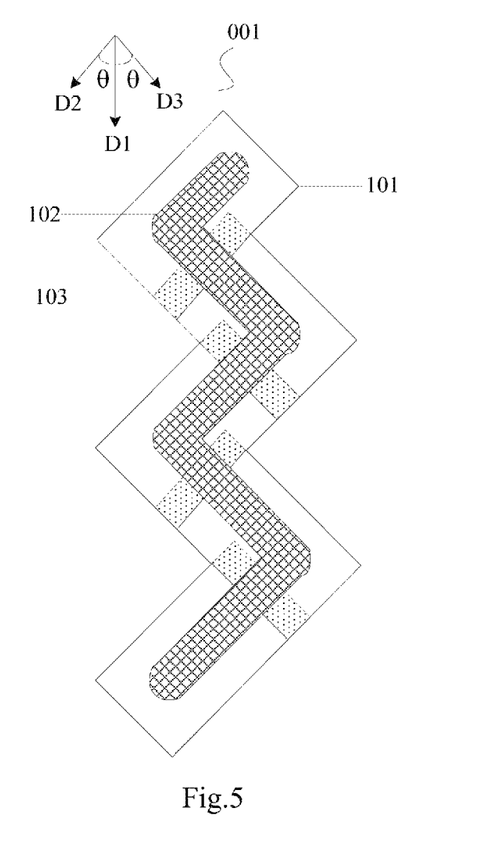

In another implementation as illustrated in FIG. 3, FIG. 5, and FIG. 6, there are different inclination directions D2 and D3 of every two wire segments 101, connected with each other, relative to the extension direction D1 of the traveling wire 001, that is, a part of the respective wire segments 101 are inclined leftward relative to the extension direction D1 of the traveling wire 001, and the other part thereof are inclined rightward relative to the extension direction D1, as illustrated in FIG. 3, FIG. 5, and FIG. 6.

It shall be noted that in the traveling wire 001 as illustrated in FIG. 3, FIG. 5, and FIG. 6 according to the embodiment of the disclosure, as can be appreciated that, every two wire segments 101 connected with each other are defined as a group, and there are different inclination directions D2 and D3 of two wire segments 101 in each group relative to the extension direction D1 of the traveling wire 001. In a real application, alternatively at least three wire segments 101 connected in sequence can be defined as a group, and there are different inclination directions of a plurality of wire segments 101 in each group relative to the extension direction D1 of the traveling wire 001. For example, three wire segments 101 connected in sequence are defined as a group, where there is the substantially same inclination direction of any two of the wire segments 101, which is different from the inclination direction of the remaining wire segment 101.

It shall be noted that the hole structures 102 of the respective wire segments 101 in the traveling wire 001 as illustrated in FIG. 2 and FIG. 4 have a larger area on a straight line parallel to the extension direction D1 of the traveling wire 001 than the hole structures 102 of the respective wire segments 101 in the traveling wire 001 as illustrated in FIG. 3, FIG. 5, and FIG. 6, so it will be easier to decentralize a bending stress on the traveling wire 001, thus further lowering a risk of the traveling wire 001 being cracked or broken.

Optionally in the flexible display substrate above according to the embodiment of the disclosure, as illustrated in FIG. 2 to FIG. 6, there may be the same inclination angle θ of the respective wire segments 101 relative to the extension direction D1 of the traveling wire 001, that is, there is the same angle between the extension direction D1 of the traveling wire 001, and the inclination directions D2 and D3 of the respective wire segments 101, where the respective wire segments 101 in the inclination direction D2 are parallel to each other, and the respective wire segments 101 in the inclination direction D3 are parallel to each other. This arrangement can simplify the fabrication process, improve the production efficiency, and lower the production cost. Of course, in an optional implementation, the inclination angles θ of the respective wire segments 101 relative to the extension direction D1 of the traveling wire 001 can alternatively be preset to a plurality of different angles, although the embodiment of the disclosure will not be limited thereto.

In an optional implementation, in the flexible display substrate above according to the embodiment of the disclosure, the number of hole structures 102 in the respective wire segments 101 will not be limited to any particular number, and for example, the respective wire segments 101 can include one hole structure 102 respectively as illustrated in FIG. 2 and FIG. 3; or the respective wire segments 101 can include two hole structures 102 respectively as illustrated in FIG. 4 and FIG. 6. Of course, there may be more hole structures 102 arranged on the respective wire segments 101 as needed in reality, although the embodiment of the disclosure will not be limited thereto. Moreover as illustrated in FIG. 6, when there are two hole structures 102 in the respective wire segments 101, a part of the traveling wires 001 as illustrated can be transformed up-leftward so that hole structures 102 of two adjacent connecting wire segments 101 overlap with each other to obtain the traveling wires 001 as shown on right in FIG. 6.

Optionally in the flexible display substrate above according to the embodiment of the disclosure, the material of the traveling wire 01 is a metal material, e.g., one or an alloy combination of molybdenum, aluminum, tungsten, titanium, and copper, although the embodiment of the disclosure will not be limited thereto.

Optionally in the flexible display substrate above according to the embodiment of the disclosure, as illustrated in FIG. 5, the hole structures 102 in the respective wire segments 101 can be communicated with each other, that is, the traveling wire 001 includes only one hole, running through the traveling wire 001, into which the respective hole structures 102 are communicated with each other.

Optionally in order to lower a risk of the traveling wire 001 being broken, in the flexible display substrate above according to the embodiment of the disclosure, as illustrated in FIG. 2 to FIG. 4, the hole structures 102 in the respective wire segments 101 are separate from each other, that is, the hole structures 102 in the respective wire segments 101 are not communicated with each other, but the areas of the hole structures 102 (as denoted in a solid circle in FIG. 2 to FIG. 4) are arranged spaced from the metal (as denoted in a dotted circle in FIG. 2 to FIG. 4). At this time, there may be a number of patterns in which all the areas of the hole structures 102 in the respective wire segments 101 are arranged in the extension direction D1 of the traveling wire 001, and/or in the direction perpendicular to the extension direction D1 of the traveling wire 001.

For example, the hole structures 102 in the respective wire segments 101 can be arranged in a decentralized pattern in the extension direction D1 of the traveling wire 001, and/or in the direction perpendicular to the extension direction D1 of the traveling wire 001, so that the metal of the traveling wire 001 is distributed consecutively, at the edge of, and inside the traveling wire 001, in the extension direction D1 and/or in the direction perpendicular to the extension direction D1.

Optionally in order to decentralize the bending stress on the traveling wire 001 to thereby lower the risk of the traveling wire 001 being cracked or broken, in the flexible display substrate above according to the embodiment of the disclosure, at least a part of the areas of the hole structures 102 in the respective wire segments 101 are located on a straight line which is parallel to the extension direction D1 of the traveling wire 001 and orthographic projection thereof is on the planer contact structure. For example, as illustrated in FIG. 2 and FIG. 3, a part of the areas of the hole structures 102 in the respective wire segments 101 (as denoted in a solid circle in FIG. 2 and FIG. 3) are located on a straight line L1 or L2 which is parallel to the extension direction D1 of the traveling wire 001 and the orthographic projection is on the planner contact structure; and as illustrated in FIG. 4, all the areas of the hole structures 102 in the respective wire segments 101 (as denoted in a solid circle in FIG. 4) are located respectively on straight lines L3 and L4 which are parallel to the extension direction D1 of the traveling wire 001 and the orthographic projection thereof is on the planner contact structure. This arrangement can enable a part of the areas of the hole structures 102 (as denoted in a solid circle in FIG. 2 to FIG. 4) to be spaced from the metal (as denoted in a dotted circle in FIG. 2 to FIG. 4) in the extension direction D1 of the traveling wire 001, so that the bending stress on the traveling wire 001 can be decentralized onto the respective hole structures 102 located on a straight line which is parallel to the extension direction D1 of the traveling wire 001 and the orthographic project thereof is on the planner contact structure to thereby avoid the bending stress from being propagated along the metal in the extension direction D1 of the traveling wire 001 so as to lower the risk of the traveling wire 001 being cracked or broken.

Furthermore in order to further decentralize the bending stress on the traveling wire 001 to thereby lower the risk of the traveling wire 001 being cracked or broken, in the flexible display substrate above according to the embodiment of the disclosure, at least a part of the areas of the hole structures 102 in every two wire segments 101 connected with each other are located on a straight line which is perpendicular to the extension direction D1 of the traveling wire 001 and the orthographic projection thereof is on the planner contact structure. As illustrated in FIG. 4, for example, at least a part of the areas of the hole structures 102 in every two wire segments 101 connected with each other (as denoted in a solid circle in FIG. 4) are located on a straight line L5 which is perpendicular to the extension direction D1 of the traveling wire 001 and the orthographic projection thereof is on the planner contact structure. In another example, as illustrated in FIG. 2 and FIG. 3, at least a part of the areas of the hole structures 102 in the respective wire segments 101 (as denoted in a solid circle in FIG. 2 and FIG. 3) are located respectively on straight lines L6 and L7 which are perpendicular to the extension direction D1 of the traveling wire 001 and the orthographic projection thereof is on the planner contact structure. This arrangement can enable a part of the areas of the hole structures 102 (as denoted in a solid circle in FIG. 2 to FIG. 4) to be spaced from the metal (as denoted in a dotted circle in FIG. 2 to FIG. 4) in the direction perpendicular to the extension direction D1 of the traveling wire 001, so that the bending stress on the traveling wire 001 can be decentralized onto the respective hole structures 102 located on a straight line which is perpendicular to the extension direction D1 of the traveling wire 001 and the orthographic projection thereof is on the planner contact structure to thereby avoid the bending stress from being propagated along the metal in the direction perpendicular to the extension direction D1 of the traveling wire 001 so as to lower the risk of the traveling wire 001 being cracked or broken.

As can be apparent from the description above, in the flexible display substrate above according to the embodiment of the disclosure, in order to decentralize the bending stress on the traveling wire 001 as much as possible, as illustrated in FIG. 2 to FIG. 4, the hole structures 102 in the respective wire segments 101 of the traveling wire 001 shall be arranged reasonably on the traveling wire 001 to thereby enable the areas of the hole structures 102 on any straight line which is parallel to the extension direction D1 of the traveling wire 001 and the orthographic projection thereof is on the planner contact structure, and on any straight line which is perpendicular to the extension direction D1 of the traveling wire 001 and the orthographic projection thereof is on the planner contact structure (as denoted in a solid circle in FIG. 2 to FIG. 4) to be arranged spaced from the metal (as denoted in a dotted circle in FIG. 2 to FIG. 4).

Correspondingly the traveling wire 001 in the flexible display substrate above according to the embodiment of the disclosure was tested and evaluated, and the result thereof showed that the traveling wire 001 had not been broken even after it was bent five times, and the difference in resistance thereof between after and before it was bent was less than 1%.

Optionally in the flexible display substrate above according to the embodiment of the disclosure, the traveling wire 001 can be one or a combination of a scan line, a data signal line, a clock signal line, and a touch signal line, or, of course, the traveling wire 001 can alternatively be another traveling wire well known in the flexible display panel, e.g., a common electrode signal line, although the embodiment of the disclosure will not be limited thereto.

In an optional implementation, in the flexible display substrate above according to the embodiment of the disclosure, the flexible display substrate can be an array substrate, an opposite substrate, or a touch substrate, although the embodiment of the disclosure will not be limited thereto.

Optionally the flexible display substrate above according to the embodiment of the disclosure can be made of a plastic material with excellent heat-resistance and durability, e.g., polyvinylether phthalate, Polyethylene naphthalate, polycarbonate, polyarylate, polyetherimide, polyethersulfone or polyimide. However the material of the flexible display substrate above according to the embodiment of the disclosure will not be limited thereto, but can alternatively be another flexible material well known to those skilled in the art, although the embodiment of the disclosure will not be limited thereto.

Based upon the same inventive idea, an embodiment of the disclosure provides a display panel including the flexible display substrate above according to the embodiment of the disclosure, and the display panel can be a liquid crystal display panel, an organic electroluminescent display panel, a quantum dot light-emitting display panel, a light-emitting diode display panel, an electronic paper display panel, a plasma display panel, an electrophoretic display panel, or a micro light-emitting diode display panel. Reference can be made to the embodiment of the flexible display substrate above for an implementation of the display panel, so a repeated description thereof will be omitted here.

Based upon the same inventive idea, an embodiment of the disclosure provides a display device including the display panel above according to the embodiment of the disclosure, and the display device can be a mobile phone, a tablet computer, a TV set, a monitor, a notebook computer, a digital photo frame, a navigator, a smart watch, a fitness wrist band, a personal digital assistant, or any other product or component with a display function. Reference can be made to the embodiment of the display panel for an implementation of the display device, so a repeated description thereof will be omitted here.

In the flexible display substrate, the display panel, and the display device above according to the embodiments of the disclosure, the flexible display includes: the flexible base substrate, and the traveling wires arranged in the fixed bending area on the flexible display substrate, where each traveling wire includes a plurality of wire segments connected in sequence; the respective wire segments are inclined at the preset inclination angle from the extension direction of the traveling wire, and at least a part of the wire segments include the porous structures. The traveling wire in the fixed bending area includes the plurality of sequentially connected wire segments at the preset inclination angle relative to the extension direction of the traveling wire, so that the bending stress on the traveling wire can be decentralized onto the respective wire segments; and furthermore the hole structures are arranged on at least a part of the wire segments, so that the bending stress decentralized onto the respective wire segments can be spread into edge areas of the hole structures, and thus the bending stress on the traveling wire can be significantly decentralized, thus greatly lowering a risk of the traveling wire being cracked or broken in the fixed bending area. Moreover there is the planar contact structure between every two wire segments connected with each other, that is, the planar contact structure is defined by two sides, in contact with each other, of every two adjacent wire segments, so that every two adjacent wire segments are connected with each other in an area-contact mode. In this way, there are a plurality of contact points between every two wire segments connected with each other, and even if the traveling wire is cracked or broken at any one of the contact points, then the two adjacent wire segments can be connected with each other at another contact point, thus further lowering the risk of the traveling wire being cracked or broken. Moreover as compared with the general traveling wire in the related art, the adjacent wire segments are arranged in a staggered and inclined pattern given an arrangement pitch of the traveling wire to thereby increase the width of the traveling wire, and lower the resistance of the traveling wire.

The term "substantially" generally refers to being within +/−20% of a target value.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A flexible display substrate, comprising: a flexible base substrate, and a traveling wires arranged in a fixed bending area on the flexible display substrate, wherein:
the traveling wire comprises a plurality of wire segments connected in sequence;

respective wire segments are inclined at a preset inclination angle from an extension direction of the traveling wire, and at least a part of the wire segments comprise a hole structure; and there is a planar contact structure between at least two of the wire segments connected with each other.

2. The flexible display substrate according to claim 1, wherein there is a substantially same inclination direction of two of the wire segments, connected with each other, relative to the extension direction of the traveling wire.

3. The flexible display substrate according to claim 1, wherein there are different inclination directions of two of the wire segments, connected with each other, relative to the extension direction of the traveling wire.

4. The flexible display substrate according to claim 2, wherein there is a substantially same inclination angle of the two of the wire segments connected with each other, relative to the extension direction of the traveling wire.

5. The flexible display substrate according to claim 3, wherein there is a substantially same inclination angle of the two of the wire segments connected with each other, relative to the extension direction of the traveling wire.

6. The flexible display substrate according to claim 1, wherein the at least two of the wire segments comprise at least one hole structure.

7. The flexible display substrate according to claim 6, wherein the hole structures in the at least two of the wire segments are communicated with each other.

8. The flexible display substrate according to claim 6, wherein the hole structures in the at least two of the wire segments are separate from each other, and a part of areas of the hole structures in the at least two of the wire segments are located on a straight line which is parallel to the extension direction of the traveling wire and an orthographic projection thereof is on the planner contact structure.

9. The flexible display substrate according to claim 6, wherein the hole structures in the at least two of the wire segments are separate from each other, and a part of areas of the hole structures in the at least two of the wire segments connected with each other are located on a straight line which is perpendicular to the extension direction of the traveling wire and an orthographic projection thereof is on the planner contact structure.

10. The flexible display substrate according to claim 1, wherein a material of the traveling wire is metal.

11. The flexible display substrate according to claim 1, wherein the traveling wire is one of a scan line, a data signal line, a clock signal line, and a touch signal line.

12. The flexible display substrate according to claim 1, wherein the traveling wire is a combination of a scan line, a data signal line, a clock signal line, and a touch signal line.

13. The flexible display substrate according to claim 1, wherein the flexible display substrate is an array substrate, an opposite substrate, or a touch substrate.

14. A display panel, comprising the flexible display substrate according to claim 1.

15. The display panel according to claim 14, wherein the display panel is a liquid crystal display panel, an organic electroluminescent display panel, or a quantum dot light-emitting display panel.

16. A display device, comprising the display panel according to claim 14.

* * * * *